United States Patent [19]

Kofron

[11] 4,153,907
[45] May 8, 1979

[54] PHOTOVOLTAIC CELL WITH JUNCTION-FREE ESSENTIALLY-LINEAR CONNECTIONS TO ITS CONTACTS

[75] Inventor: Vernon K. Kofron, Webster Groves, Mo.

[73] Assignee: Vactec, Incorporated, Maryland Heights, Mo.

[21] Appl. No.: 857,659

[22] Filed: Dec. 5, 1977

Related U.S. Application Data

[63] Continuation-in-part of Ser. No. 797,631, May 17, 1977.

[51] Int. Cl.² .............. H01L 27/14; H01L 31/00; H01L 31/14
[52] U.S. Cl. ........................ 357/30; 357/65; 357/67; 357/68; 357/73
[58] Field of Search .............. 357/54, 65, 67, 73, 357/30, 68

[56] References Cited

U.S. PATENT DOCUMENTS

| | | | |
|---|---|---|---|
| 3,374,110 | 3/1968 | Miller | 357/73 |
| 3,411,952 | 11/1968 | Ross et al. | 357/30 |
| 3,413,240 | 11/1968 | Short | 357/73 |
| 3,457,475 | 7/1969 | Chen | 357/67 |
| 3,465,209 | 9/1969 | Denning et al. | 357/54 |
| 3,472,688 | 10/1969 | Hayashi et al. | 357/67 |
| 3,496,631 | 2/1970 | Chen | 357/67 |
| 3,497,774 | 2/1970 | Hornberger | 357/73 |
| 3,620,847 | 11/1971 | Wise | 357/67 |

*Primary Examiner*—Andrew J. James
*Attorney, Agent, or Firm*—Rogers, Eilers & Howell

[57] ABSTRACT

Admixed glass frits and conductor-forming materials are applied directly to selected portions of the smooth-surface, doped areas of photovoltaic cells, and then are fired to form electrical contacts for those smooth-surface, doped areas. Those conductor-forming materials form electrical contacts that have essentially-linear, low resistance, electrical connections with those smooth-surface, doped areas and also provide exposed surfaces to which leads can be bonded; and those glass frits fuse to the smooth surfaces of the doped areas of those photovoltaic cells to provide sturdy mechanical bonds between those electrical contacts and those smooth-surface, doped areas. The admixtures of glass frits and of conductor-forming materials that are used in forming the electrical contacts for the smooth-surface, P-type doped areas on photovoltaic cells are P-type admixtures; and the admixtures of glass frits and of conductor-forming materials that are used in forming the electrical contacts for the smooth-surface, N-type doped areas on those devices are N-type admixtures.

8 Claims, 3 Drawing Figures

PHOTOVOLTAIC CELL WITH JUNCTION-FREE ESSENTIALLY-LINEAR CONNECTIONS TO ITS CONTACTS

This is a continuation-in-part of application Ser. No. 797,631 for Electrical Contacts for Semi-conductive Devices which was filed on May 17, 1977.

BACKGROUND OF THE INVENTION

In the forming of electrical contacts for the smooth-surface, doped areas of semi-conductive devices, it is customary to form thin metal films on those smooth-surface, doped areas by evaporating, sputtering and plating processes, and then to form layers of different metals on those thin metal films. For example, some smooth-surface, semi-conductive devices are placed within a chamber, the atmosphere within that chamber is evacuated, and then a quantity of metal within that chamber is evaporated so it can condense in the form of thin metal films upon the exposed portions of the smooth-surface, doped areas of those semi-conductive devices; and thereafter a layer of different metal is formed on those thin metal films. Other smooth-surface, semi-conductive devices are placed within a chamber, the atmosphere within that chamber is evacuated, and then a quantity of metal within that chamber is sputtered onto the exposed portions of the smooth-surface, doped areas of those semi-conductive devices in the form of thin metal films; and thereafter a layer of different metal is formed on those thin metal films. Still other smooth-surface, semi-conductive devices have metals plated onto the exposed portions of the smooth-surface, doped areas thereof in the form of thin metal films; and thereafter a layer of different metal is formed on those thin metal films. Those layers of different metals are formed on those thin metal films because it is difficult to solder leads to those thin metal films — either because the metals in those thin metal films do not readily alloy with solders or because those thin metal films tend to dissolve in molten solders. Also, electrical contacts, for the smooth-surface, doped areas of semi-conductive devices, which consist of thin metal films with overlying layers of different metals, tend to be fragile and to be separable from those doped areas.

Summary of the Invention: The present invention provides firmly-adherent, low-resistance electrical contacts on the smooth-surface, doped areas of photovoltaic cells by applying admixed glass frits and conductor-forming materials directly to those smooth-surface, doped areas and then firing those admixed glass frits and conductor-forming materials. To make the resulting contacts firmly adherent to the smooth-surface, doped areas, the frits are made from glass which can fuse to the smooth-surface, doped areas of the photovoltaic cells at temperatures which will not destroy those smooth-surface, doped areas; and those frits are made from glass which has a thermal coefficient of expansion that is similar to that of those photovoltaic cells. To enable the resulting contacts to have essentially-linear, low-resistance, electrical connections with the smooth-surface, doped areas of the photovoltaic cells, the admixtures of glass frits and of conductor-forming materials that are applied to the smooth-surface, P-type doped areas are P-type admixtures, and the admixtures of glass frits and of conductor-forming materials that are applied to the smooth-surface, N-type doped areas are N-type admixtures. Specifically, by using P-type materials in the admixtures that are applied to the smooth-surface, P-type doped areas of photovoltaic cells, the present invention keeps n-p junctions or other non-linear junctions from forming at the smooth surfaces of those P-type doped areas. Also, by using P-type materials in the admixtures that are applied to the smooth-surface, P-type doped areas of photovoltaic cells, the present invention keeps the depths, to which those admixtures penetrate into those doped areas, from being critical; because even excessive penetration of those admixtures into those doped areas would merely increase the overall depths of those doped areas. Similarly, by using N-type materials in the admixtures that are applied to the smooth-surface N-type doped areas of photovoltaic cells, the present invention keeps p-n junctions or other non-linear junctions from forming at the smooth surfaces of those N-type doped areas. Also by using N-type materials in the admixtures that are applied to the smooth-surface, N-type doped areas of photovoltaic cells, the present invention keeps the depths, to which those admixtures penetrate into those doped areas, from being critical; because even excessive penetration of those admixtures into those doped areas would merely increase the overall depths of those doped areas. It is, therefore, an object of the present invention to form contacts for the smooth-surface, doped areas of photovoltaic cells by applying P-type admixtures of glass frits and of conductor-forming materials directly to the smooth-surface, P-type areas of those photovoltaic cells or by applying N-type admixtures of glass frits and of conductor-forming materials directly to the smooth-surface, N-type doped areas of those photovoltaic cells, and then firing those admixtures to cause the glass frits thereof to mechanically bond to those smooth-surface, doped areas and to cause the conductor-forming materials thereof to form essentially-linear, low-resistance electrical junctions with those doped areas.

Other and further objects and advantages of the present invention should become apparent from an examination of the drawing and accompanying description.

In the drawing and accompanying description a preferred embodiment of the present invention is shown and described but it is to be understood that the drawing and accompanying description are for the purpose of illustration only and do not limit the invention and that the invention will be defined by the appended claims.

DETAILED DESCRIPTION OF THE PREFERRED EMBODIMENT

Figure 1:
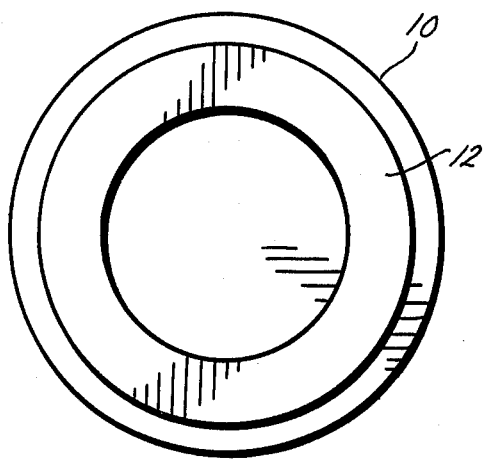
FIG. 1 is a plan view of one preferred embodiment of photovoltaic cell which has electrical contacts that were formed in accordance with the principles and teachings of the present invention.
Figure 3:
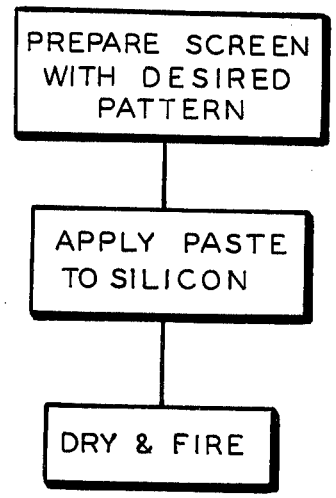
FIG. 3 is an operational diagram showing the steps used in forming the electrical contacts of FIGS. 1 and 2.
Figure 2:
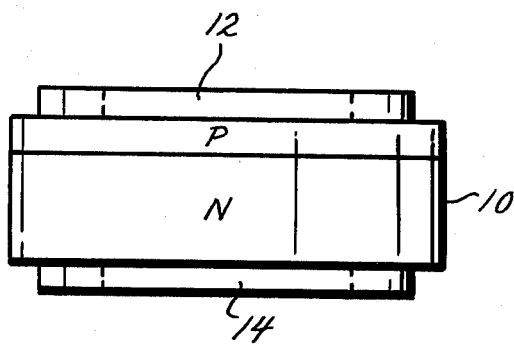
FIG. 2 is a side elevational view of the photovoltaic cell of FIG. 1.

Referring to the drawing in detail, the numeral 10 denotes a photovoltaic cell which has an electrical contact 12 of annular form on the upper surface thereof and which has an electrical contact 14 of annular form on the lower surface thereof. In the said one preferred embodiment, the photovoltaic cell 10 is a silicon solar cell which is made by starting with an N-type silicon wafer that has smooth upper and lower surfaces and by doping the upper surface thereof to serve as a P-type area. The starting N-type silicon wafer can have the upper surface thereof doped to the extent, and in any of the several ways, known to those skilled in the trade. In the said preferred embodiment, the resistivity of the starting N-type silicon wafer, and hence the resistivity of the lower surface of the photovoltaic cell 10, is in the range of one-half to eight hundred ohm-cms; and the sheet resistivity of the doped upper surface is in the range of one to ten ohms per square. The electrical contact 12 overlies and is integral with the P-type doped smooth upper surface of the photovoltaic cell 10, while the electrical contact 14 underlies and is integral with the N-type smooth lower surface of that photovoltaic cell.

In the said preferred embodiment, the starting silicon wafer is doped with phosphorus to have N-type upper and lower surfaces; and then the upper surface of that silicon wafer has boron vapors diffused into it to provide the desired P-type doping for that upper surface. However, the nature of the dopants, and the extent of doping, are not critical in the present invention.

After the boron vapors have been diffused into the upper surface of the starting silicon wafer, that upper surface will be treated with hydrofluoric acid or with buffered hydrofluoric acid to remove the boron glass phase which formed on that upper surface as the boron vapors were being diffused into that upper surface. Thereafter, the upper surface of the silicon wafer will be rinsed in de-ionized water and methanol. A mask, which defines the annular form of the electrical contact 12, will then be placed on the upper surface of the silicon wafer; and admixed glass frits and conductor-forming materials will be printed through that mask onto that upper surface.

In the said preferred embodiment, the mask is made from a two hundred mesh stainless steel screen by filling the interstices of that screen which are located outwardly and inwardly of the desired annular configuration. Also, in the said preferred embodiment the glass frits and the conductor-forming materials are components of a paste which has the following proportions and ingredients:

| Percent By Weight | Ingredient |
| --- | --- |
| 56.4 | Silver Powder |
| 14.1 | Palladium Black |
| 3.0 | $Bi_2O_3$ |
| 1.5 | Borosilicate glass |
| 3.6 | Ethyl cellulose |
| 1.6 | 2-furoic acid |
| 17.3 | Butyl carbitol acetate |
| 2.5 | Igepal CO430 |

The Igepal CO430 is a product of General Aniline and Film, Inc. The silver powder and the palladium black constitute the conductor-forming materials and the borosilicate glass constitutes the glass frits which form the electrical contact 12. The bismuth oxide acts as a flux; and the ethyl cellulose, the 2-furoic acid, the butyl carbitol acetate, and the Igepal CO403 coact to serve as a vehicle.

After the paste has been printed onto the upper surface of the photovoltaic cell 10 through the mask, that mask will be removed; and the annulus of paste will be permitted to air dry for fifteen minutes. During those fifteen minutes, the surface tension of the paste will make the exposed surface of the paste smooth, level and free of mesh marks. Thereafter, the photovoltaic cell 10 will be dried for one-half of an hour in an oven which has forced ventilation and which maintains a temperature of one hundred and twenty-five degrees centigrade. Subsequently, the photovoltaic cell 10 will be placed in a belt furnace which has a forty-five minute cycle and which will hold that photovoltaic cell at a peak temperature of seven hundred and fifty degrees centigrade for six to ten minutes. During the firing of the electrical contact 12, which occurs in the belt furnace, the conductor-forming materials and the glass frits fully penetrate the thin film of oxide which unavoidably formed on the upper surface of the photovoltaic cell 10 between the time that upper surface was rinsed in de-ionized water and methanol and the time the annulus of paste was printed onto that upper surface. Also during the firing of that electrical contact, the glass frits form a rugged and sturdy mechanical bond with the upper surface of the photovoltaic cell 10; and the silver powder and the palladium black sinter to each other and to that upper surface to form an essentially-linear, low resistance, electrical connection with the P-type doped upper surface. The exposed surface of the electrical contact 12 can have leads affixed thereto by thermocompression bonding, by ultrasonic bonding, or by a tin-lead solder. The mechanical bond which the fired glass frits form with the upper surface of the photovoltaic cell 10 is so sturdy and so rugged that the electrical contact 12 will retain its essentially-linear, low resistance, electrical connection with that upper surface despite the application of appreciable pressures and forces to those leads during the subsequent installation and use of the silicon solar cell.

The temperatures and times used in firing the electrical contact 12 are not critical; and higher temperatures and longer times can be used. This is the case because the admixture of conductor-forming materials and of glass frits is a P-type admixture; and hence any undue penetration of that admixture into the photovoltaic cell 10, which could occur if higher temperatures and longer firing times were used, would merely shift the location of, and would not change the polarity of, the p-n junction between the upper and lower surfaces of that photovoltaic cell.

To apply the electrical contact 14 to the lower surface of the photovoltaic cell 10, that lower surface will be cleaned with de-ionized water and methanol; and than a mask, which defines the annular form of the electrical contact 14, will be placed on that lower surface, and admixed glass frits and conductor-forming materials will be printed through that mask onto that lower surface. That mask can be identical to the mask which is used to form the electrical contact 12 on the upper surface of the photovoltaic cell 10. In the said preferred embodiment, the glass frits and the conductor-forming materials are components of a paste which has the following proportions and ingredients:

| Percent by Weight | Ingredient |
| --- | --- |
| 11. | Phosphorus-doped nickel powder |
| 47.5 | Silver Powder |
| 12. | Palladium Black |
| 3.0 | $Bi_2O_3$ |
| 1.5 | Borosilicate glass |
| 3.6 | Ethyl cellulose |
| 1.6 | 2-furoic acid |
| 17.3 | Butyl carbitol acetate |

| Percent by Weight | Ingredient |
|---|---|
| 2.5 | Igepal CO430 |

The phosphorus-doped nickel powder, the silver powder and the palladium black constitute the conductor-forming materials and the borosolicate glass constitutes the glass frits which form the electrical contact 14. The bismuth oxide acts as a flux; and the ethyl cellulose, the 2-furoic acid, the butyl carbitol acetate, and the Igepal CO430 coact to serve as a vehicle. The phosphorus-doped nickel powder can be formed in different ways; as by using nickel phosphide in the production of the nickel powder, or by producing the nickel powder by decomposing an electroless nickel plating solution containing phosphorus in the form of a hypophosphite.

After the paste has been printed onto the lower surface of the photovoltaic cell 10 through the mask, that mask will be removed; and the annulus of paste will be permitted to air dry for fifteen minutes. During those fifteen minutes, the surface tension of the paste will make the exposed surface of the paste smooth, level and free of mesh marks. Thereafter, the photovoltaic cell 10 will be dried for one-half of an hour in an oven which has forced ventilation and which maintains a temperature of one hundred and twenty-five degrees centigrade. Subsequently, the photovoltaic cell 10 will be placed in a belt furnace which has a forty-five minute cycle and which will hold that photovoltaic cell at a peak temperature of seven hundred and fifty degrees centigrade for six to ten minutes. During the firing of the electrical contact 14, which occurs in the belt furnace, the conductor-forming materials and the glass frits fully penetrate the thin film of oxide which unavoidably formed on the lower surface of the photovoltaic cell 10 between the time that lower surface was cleaned in de-ionized water and methanol and the time the annulus of paste was printed onto that lower surface. Also during the firing of that electrical contact, the glass frits form a rugged and sturdy mechanical bond with the lower surface of the photovoltaic cell 10; and the nickel powder and the silver powder and the palladium black sinter to each other and to that lower surface to form an essentially-linear, low resistance, electrical connection with that N-type doped lower surface. The exposed surface of the electrical contact 14 can have leads affixed thereto by thermocompression bonding, by ultrasonic bonding, or by a tin-lead solder. The mechanical bond which the fired glass frits form with the lower surface of the photovoltaic cell 10 is so sturdy and so rugged that the electrical contact 14 will retain its essentially-linear, low resistance, electrical connection with that lower surface despite the application of appreciable pressures and forces to those leads during the subsequent installation and use of the silicon solar cell.

The temperatures and times used in firing the electrical contact 14 are not critical; and higher temperatures and longer times can be used. This is the case because the admixture of conductor-forming materials and of glass frits is an N-type admixture; and hence any undue penetration of that admixture into the photovoltaic cell 10, which could occur if higher temperatures and longer firing times were used, would merely shift the location of, and would not change the polarity of, the n-p junction between the upper and lower surfaces of that photovoltaic cell.

The paste which is used to form the electrical contact 14 could have the silver powder and the palladium black eliminated therefrom and could have the percentage of phosphorus-doped nickel powder therein increased to about seventy percent if a belt furnace was available in which a reducing atmosphere could be maintained. However, by making the amount of phosphorus-doped nickel powder as small as from ten to twenty-five percent of the combined weight of the silver powder and palladium black, it is not necessary to fire the electrical contact 14 in a reducing atmosphere.

If desired, silver powder and palladium black could be used as the only conductor-forming materials in the paste for the electrical contact 14 by reducing the percentage of the borosilicate glass to one-half of one percent and by using at least one percent of phosphorus-based glass. Where more than one percent of phosphorus-based glass was used, the percentage of silver powder and palladium black would be reduced to keep the sum of the percentages of ingredients from exceeding one hundred. The reduction of the borosilicate glass to five-tenths of one percent and the addition of the phosphorus-based glass to the extent of at least one percent would enable the paste, which was intended for use in making the electrical contact 12, to be used in making the electrical contact 14. This is due to the fact that the phosphorus-based glass will effectively make that paste have N-type characteristics.

The bismuth oxide, in the paste which is used to make the electrical contacts 12 and 14, could be used as an N-type dopant. However, the diffusion rate of bismuth oxide is much slower than the diffusion rate of the borosilicate glass; and hence, although the paste which is used in making the electrical contact 12 contains bismuth oxide, that paste acts as a P-type paste.

The electrical contacts 12 and 14 are shown in the form of annuli; and such electrical contacts are effective and are relatively inexpensive. Where the photovoltaic cell 10 is a solar cell, an annular electrical contact is desirable on the upper surface thereof; because such an electrical contact exposes a large central area of that upper surface to radiation. However, any desired configuration could be provided for the electrical contact 12, or the electrical contact 14, or for both of those electrical contacts.

If either surface of the photovoltaic cell 10 did not have to be smooth and, instead, could be roughened by an etching operation or by a sandblasting operation, the electrical contact for that surface could be formed by an electro-plating process rather than by the process described herein. For example, in solar cells, the electrical contacts 12 will preferably be formed by the process of the present invention, because the upper surfaces of such cells must be very smooth; but the electrical contacts 14 can be formed by an electrical plating process, because the lower surfaces of such cells can be roughened by an etching or sandblasting operation.

Two paste formulations have been described in detail herein, but many other paste formulations could be used. The primary requirement of any paste that is made in accordance with the present invention is that the type of electrical polarity which it has be the same as the type of electrical polarity possessed by the smooth surface to which it will be applied.

Whereas the drawing and accompanying description have shown and described a preferred embodiment of the present invention, it should be apparent to those skilled in the art that various changes may be made in the form of the invention without affecting the scope thereof.

What I claim is:

1. A photovoltaic cell that has a first region with a P dopant which makes said first region a P region, a second region with an N dopant which makes said second region an N region, an electrical contact which is connected to said P region and which includes an admixture of a fused glass component and of a conductor-forming component, one of said components having P-forming properties which make said electrical contact a P electrical contact, said electrical contact coacting with said P region to provide a connection to said P region which is devoid of a junction and hence is an essentially-linear, low-resistance electrical connection, and a second contact which is substantially free from P-type impurities and which is connected to said N region, said second contact coacting with said N region to provide a connection to said N region which is devoid of a junction and hence is an essentially-linear low-resistance electrical connection.

2. A photovoltaic cell as claimed in claim 1 wherein said P region is smooth, and wherein the first said electrical contact has a thermal coefficient of expansion which is similar to that of said P region.

3. A photovoltaic cell that has a first region with a dopant which makes said first region have a predetermined one of the "N" and "P" electrical polarities, a second region with a dopant which makes said second region have the opposite of said electrical polarities, an electrical contact which is connected to said first region and which includes an admixture of a fused glass component and of a conductor-forming component, one of said components having polarity-forming properties which make said electrical contact have said predetermined one of said electrical polarities, said electrical contact coacting with said first region to provide a connection to said first region which is devoid of a junction and hence is an essentially-linear low-resistance electrical connection, and a second contact which is substantially free from impurities which can form said predetermined one of said electrical polarities and which is connected to said second region, said second contact coacting with said second region to provide a connection to said second region which is devoid of a junction and hence is an essentially-linear low-resistance electrical connection.

4. A photovoltaic cell as claimed in claim 3 wherein said first region is an N region, wherein said one component of the first said electrical contact includes a phosphorous-doped metal, and wherein said phosphorous-doped metal makes said first said electrical contact an N electrical contact, wherein said second region is a P region, and wherein said second contact is substantially-free from N-type impurities.

5. A photovoltaic cell as claimed in claim 3 wherein said first region is an N region, wherein said fused glass component of the first said electrical contact includes phosphorus, and wherein said phosphorous makes said first said electrical contact an N electrical contact, wherein said second region is a P region, and wherein said second contact is substantially-free from N-type impurities.

6. A photovoltaic cell that has a first region with a P dopant which makes said first region a P region, a second region with an N dopant which makes said second region an N region, an electrical contact which is connected to said P region and which includes an admixture of a fused glass component and of a conductor-forming component, one of said components have P-forming properties which make said electrical contact a P electrical contact, said electrical contact coacting with said P region to provide a connection to said P region which is devoid of a junction and hence is an essentially-linear low-resistance electrical connection, and a second electrical contact which is connected to said N region and which includes an admixture of a fused glass component and of a conductor-forming component, one of said components having N-forming properties which make said electrical contact an N electrical contact, said second electrical contact coacting with said N region to provide a connection to said N region which is devoid of a junction and hence is an essentially-linear low-resistance electrical connection.

7. A photovoltaic cell as claimed in claim 6 wherein the surface of said P region is smooth, wherein the surface of said N region is smooth, wherein said P electrical contact has a thermal coefficient of expansion which is similar to that of said P region, and wherein said N electrical contact has a thermal coefficient of expansion which is similar to that of said N region.

8. A photovoltaic cell as claimed in claim 6 wherein said fused glass component of said P electrical contact provides the P polarity for said P electrical contact, and wherein said fused glass of said N electrical contact provides the N polarity for said N electrical contact.

* * * * *